US010516107B2

(12) United States Patent
Hsieh et al.

(10) Patent No.: US 10,516,107 B2
(45) Date of Patent: Dec. 24, 2019

(54) MEMORY CELL HAVING RESISTANCE VARIABLE FILM AND METHOD OF MAKING THE SAME

(71) Applicant: Taiwan Semiconductor Manufacturing Company, Ltd., Hsinchu (TW)

(72) Inventors: Ching-Pei Hsieh, Kaohsiung (TW); Chia-Shiung Tsai, Hsinchu (TW); Chern-Yow Hsu, Chu-Bei (TW); Fu-Ting Sung, Yangmei (TW); Shih-Chang Liu, Alian Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/217,318

(22) Filed: Dec. 12, 2018

(65) Prior Publication Data
US 2019/0115531 A1 Apr. 18, 2019

Related U.S. Application Data

(63) Continuation of application No. 15/817,916, filed on Nov. 20, 2017, now Pat. No. 10,158,069, which is a continuation of application No. 13/969,394, filed on Aug. 16, 2013, now Pat. No. 9,837,605.

(51) Int. Cl.
*H01L 45/00* (2006.01)
(52) U.S. Cl.
CPC .......... *H01L 45/1253* (2013.01); *H01L 45/08* (2013.01); *H01L 45/1226* (2013.01); *H01L 45/146* (2013.01); *H01L 45/16* (2013.01)

(58) Field of Classification Search
CPC ... H01L 45/08; H01L 45/1233; H01L 45/124; H01L 45/16
See application file for complete search history.

(56) References Cited

U.S. PATENT DOCUMENTS

| 6,682,944 | B2 | 1/2004 | Kikuchi et al. |
| 7,298,043 | B2 | 11/2007 | Yui |
| 7,504,652 | B2 | 3/2009 | Huang |

(Continued)

FOREIGN PATENT DOCUMENTS

| CN | 100495756 C | 6/2009 |
| CN | 101635331 A | 1/2010 |

(Continued)

OTHER PUBLICATIONS

Notice of Allowance dated Jun. 19, 2015 from corresponding No. KR 10-2014-0104293.

(Continued)

*Primary Examiner* — Mark V Prenty
(74) *Attorney, Agent, or Firm* — Slater Matsil, LLP

(57) ABSTRACT

A manufacture includes a first electrode having an upper surface and a side surface, a resistance variable film over the first electrode, and a second electrode over the resistance variable film. The resistance variable film extends along the upper surface and the side surface of the first electrode. The second electrode has a side surface. A portion of the side surface of the first electrode and a portion of the side surface of the second electrode sandwich a portion of the resistance variable film.

20 Claims, 7 Drawing Sheets

(56) References Cited

U.S. PATENT DOCUMENTS

| | | |
|---|---|---|
| 7,667,221 B2 | 2/2010 | Song et al. |
| 7,897,951 B2 | 3/2011 | Rinerson et al. |
| 7,910,908 B2 | 3/2011 | Chang |
| 7,911,030 B2 | 3/2011 | Chung |
| 7,923,712 B2 | 4/2011 | Arnold et al. |
| 8,325,507 B2 | 12/2012 | Yang et al. |
| 8,686,389 B1 | 4/2014 | Wang et al. |
| 9,837,605 B2 | 12/2017 | Hsieh et al. |
| 10,158,069 B2 * | 12/2018 | Hsieh .................. H01L 45/1253 |
| 2003/0166326 A1 | 9/2003 | Kikuchi et al. |
| 2004/0161874 A1 | 8/2004 | Moore et al. |
| 2005/0184282 A1 * | 8/2005 | Lai ...................... H01L 27/2436 257/4 |
| 2006/0054950 A1 | 3/2006 | Baek et al. |
| 2007/0012905 A1 | 1/2007 | Huang |
| 2007/0189065 A1 | 8/2007 | Suh et al. |
| 2009/0008621 A1 | 1/2009 | Lin et al. |
| 2009/0298253 A1 | 12/2009 | Rossel et al. |
| 2010/0001253 A1 | 1/2010 | Arnold et al. |
| 2010/0027319 A1 | 2/2010 | Noshiro |
| 2010/0110758 A1 | 5/2010 | Li et al. |
| 2011/0220862 A1 | 9/2011 | Arita et al. |
| 2011/0291064 A1 | 12/2011 | Marsh et al. |
| 2014/0287535 A1 | 9/2014 | Kim et al. |
| 2015/0048298 A1 | 2/2015 | Hsieh et al. |
| 2018/0090680 A1 | 3/2018 | Hsieh et al. |

FOREIGN PATENT DOCUMENTS

| | | |
|---|---|---|
| CN | 103682095 A | 3/2014 |
| JP | 2009146943 A | 7/2009 |
| KR | 20060023860 A | 3/2006 |

OTHER PUBLICATIONS

Office Action dated Mar. 31, 2015 and English Translation from corresponding No. KR 10-2014-0104293.

Wong, H.-S. Phillip, et al., "Metal-Oxide RRAM", vol. 100, No. 6, Jun. 2012, Proceedings of the IEEE, pp. 1951-1970.

* cited by examiner

MEMORY CELL HAVING RESISTANCE VARIABLE FILM AND METHOD OF MAKING THE SAME

PRIORITY CLAIM AND CROSS-REFERENCE

This application is a continuation of U.S. patent application Ser. No. 15/817,916, filed on Nov. 20, 2017, entitled "Memory Cell Having Resistance Variable Film and Method of Making the Same," which is a continuation of U.S. patent application Ser. No. 13/969,394, filed on Aug. 16, 2013, entitled "Memory Cell Having Resistance Variable Film and Method of Making the Same," which applications are hereby incorporated herein by reference in their entireties.

BACKGROUND

In integrated circuit (IC) devices, resistive random access memory (RRAM) is an emerging technology for next generation non-volatile memory devices. RRAM refers to a memory structure including an array of RRAM cells each storing a bit of data using resistance, rather than electronic charge. In some applications, a RRAM cell includes a resistance variable layer, which is an insulating material capable of being configured to provide a conductive path through a filament formed after application of a predetermined threshold voltage. Once the filament is formed, the filament is operable to be set (i.e., re-formed, resulting in a lower resistance across the RRAM cell) or reset (i.e., broken, resulting in a high resistance across the RRAM) by appropriately applied voltages. The low and high resistance states thus are utilized to indicate a digital signal of "1" or "0," and thereby provide a non-volatile memory cell that can store a bit.

BRIEF DESCRIPTION OF THE DRAWINGS

One or more embodiments are illustrated by way of example, and not by limitation, in the figures of the accompanying drawings, wherein elements having the same reference numeral designations represent like elements throughout.

DETAILED DESCRIPTION

Figure 1A:
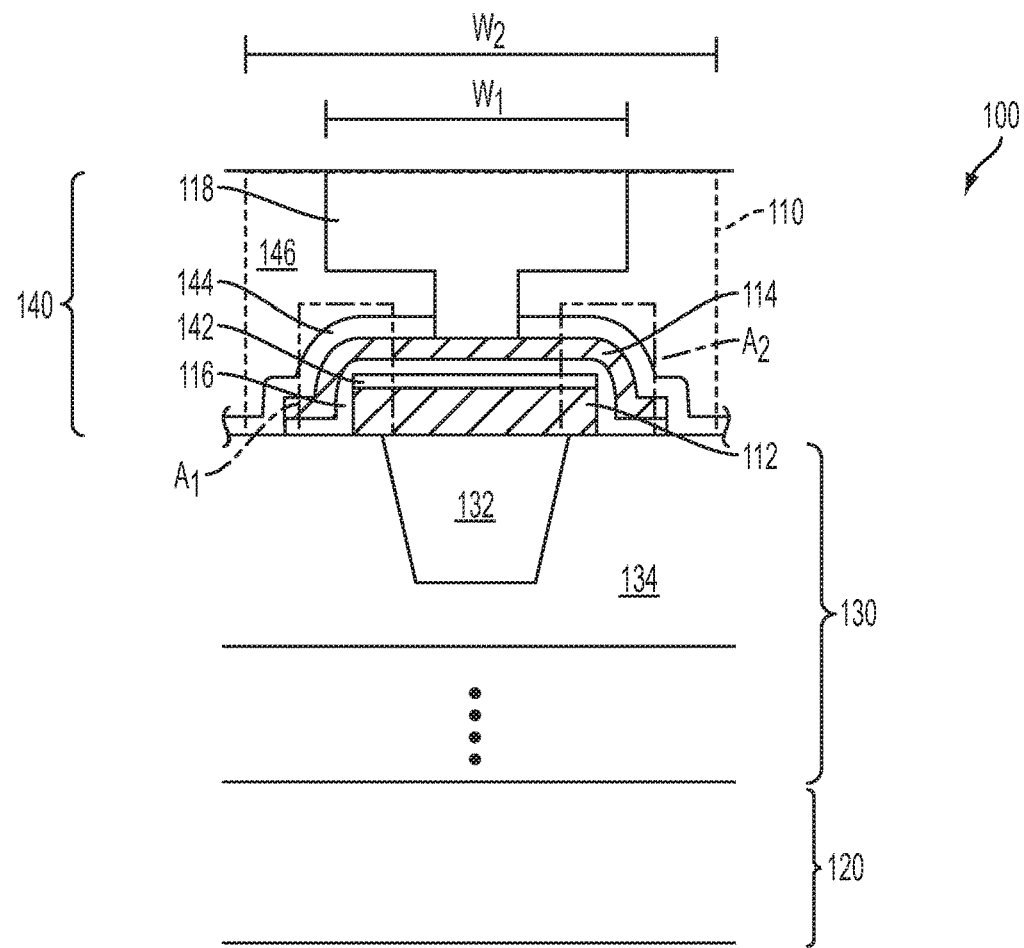
FIG. 1A is a cross-sectional view of a portion of an electrical device including an RRAM cell in accordance with one or more embodiments.

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1B:
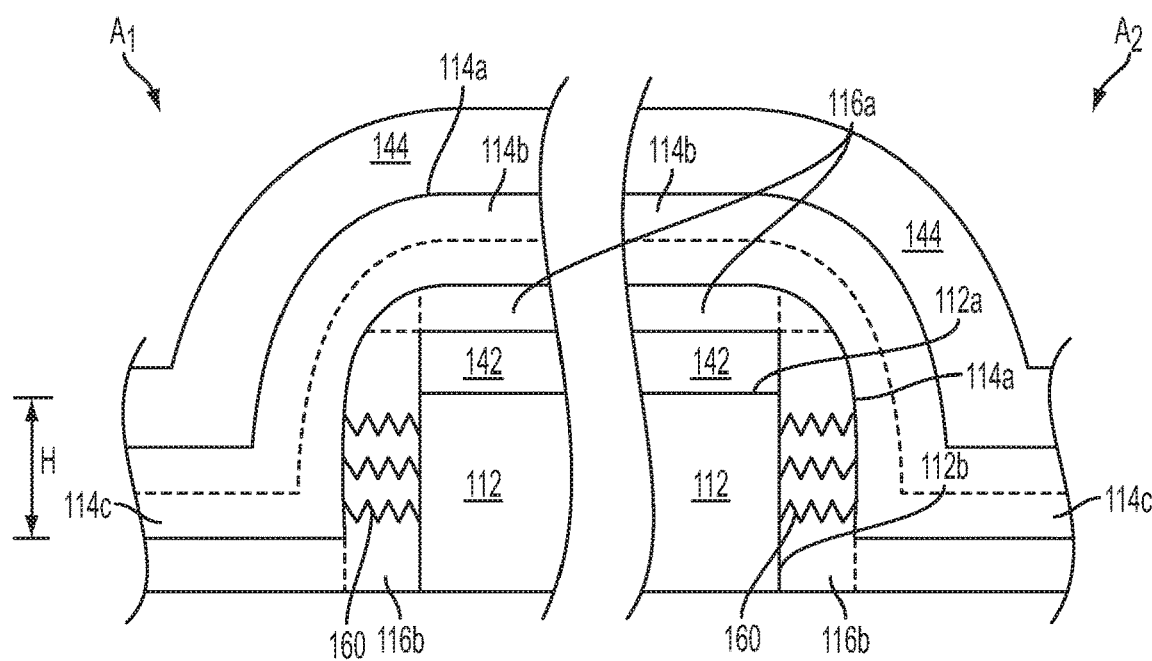
FIG. 1B is an enlarged view of regions A1 and A2 in FIG. 1 in accordance with one or more embodiments.

FIG. 1A is a cross-sectional view of a portion of an electrical device 100 including an RRAM cell 110 in accordance with one or more embodiments. FIG. 1B is an enlarged view of regions A1 and A2 in FIG. 1 in accordance with one or more embodiments. Device 100 includes a substrate 120, one or more interconnection layers 130 over substrate 120, and RRAM cell 110 over interconnection layers 130. RRAM cell 110 is formed within another interconnection layer 140 above interconnection layers 130.

RRAM cell 110 includes a first electrode 112, a second electrode 114 covering first electrode 112, a resistance variable film 116 between first electrode 112 and second electrode 114, and a conductive member 118 on second electrode 114. Resistance variable film 116 has an upper portion 116a over first electrode 112 and extending along an upper surface 112a of first electrode 112. Resistance variable film 116 also has a side portion 116b extending along a side surface 112b of first electrode 112. Second electrode 114 is over resistance variable film 116. Second electrode 114 has a side surface 114a, and a portion of side surface 112b of first electrode 112 and a portion of side surface 114a of second electrode 114 sandwiches a portion of the side portion 116b of resistance variable film 116. RRAM cell 110 further includes a dielectric layer 142 over an upper surface 112a of first electrode 112, an etch stop layer 144 covering second electrode 114 and surrounding a lower portion of conductive member 118, and another dielectric layer 146 over second electrode 114 and etch stop layer 144 and surrounding conductive member 118. Etch stop layer 144 and dielectric layer 146 extend beyond the portion occupied by RRAM cell 110 in the interconnection layer 140. In some embodiments, dielectric layer 142 is a hard mask layer. In some embodiments, dielectric layer 142 is omitted.

In some embodiments, conductive member 118 is formed by first performing an etching process to define an opening (374 in FIG. 3J) in dielectric layer 146. The portion of resistance variable film 116 sandwiched by side surface 112b of first electrode 112 and side surface 114a of second electrode 114 are arranged away from being directly under the opening 374. Compared with a configuration that a sandwiched portion of resistance variable film is directly under where a via opening and/or a trench opening is formed, the portion of resistance variable film 116 sandwiched between side surface 112b and side surface 114a according to the embodiments described herein is less likely to be affected or damaged by an etching process for forming the opening 374.

In some embodiments, first electrode 112 and/or second electrode 114 are electrically coupled to one or more electrical components on substrate 120 though the one or more layers of interconnection layers 130. In some embodiments, first electrode 112 has a circular shape or a polygon shape when it is viewed from the top of the RRAM cell 110. In some embodiments, first electrode 112 has one or more layers of conductive materials. In some embodiments, first electrode 112 has a material comprising platinum (Pt), aluminum, copper, titanium nitride (TiN), gold (Au), titanium (Ti), tantalum (Ta), tantalum nitride (TaN), tungsten (W), tungsten nitride (WN), or combinations thereof. In some embodiments, first electrode 112 has a width W1 ranging from 70 nm to 300 nm. In some embodiments, second electrode 114 has one or more layers of conductive materials. In some embodiments, second electrode 114 has a circular shape or a polygon shape when it is viewed from the top of the RRAM cell 110. In some embodiments, second electrode 114 has a material comprising Pt, Al, Cu, TiN, Au, Ti, Ta, TaN, W, WN, or combinations thereof. In some embodiments, second electrode 114 has a width W2 greater than W1.

In some embodiments, second electrode 114 includes a main portion 114b and a capping layer 114c extending between main portion 114b and resistance variable film 116. In some embodiments, main portion 114b has a material comprising Ti, Ta, TiN, or TaN. In some embodiments, capping layer 114c has a material comprising Ti, Pt, or ruthenium (Ru).

Substrate 120 herein generally refers to a bulk substrate on which various layers and device structures are formed. In some embodiments, the bulk substrate includes silicon or a compound semiconductor, such as GaAs, InP, Si/Ge, or SiC. Examples of the layers include dielectric layers, doped layers, polysilicon layers, or conductive layers. Examples of the device structures include transistors, resistors, and/or capacitors, which may be interconnected through one or more interconnect layers 130, interconnection layer 140, and/or one or more interconnect layers above interconnection layer 140 to additional integrated circuits.

Interconnection layers 130 include various conductive lines and via plugs arranged to electrically coupling the active and passive electrical devices on substrate 120 and to electrically coupling RRAM cell 110 with one or more of the active and passive electrical devices on substrate 120. As depicted in FIG. 1A, interconnection layers 130 include a conductive line 132 and a dielectric layer 134 surrounding the conductive line 132. Interconnection layer 140 is on dielectric layer 134. First electrode 112 of RRAM cell 110 is electrically coupled to the conductive line 132, which is in turn electrically coupled with one or more of active and passive electrical devices on substrate 120. In some embodiments, the one or more interconnection layers 130 are omitted, and interconnection layer 140 is on substrate 120. In some embodiments, one or more other interconnection layers, passivation layers, and bump structures are formed over interconnection layer 140.

In some embodiments, dielectric layers 134 and 146 have a material including silicon oxide, fluorinated silica glass (FSG), carbon doped silicon oxide, tetra-ethyl-ortho-silicate (TEOS) oxide, phosphosilicate glass (PSG), borophosphosilicate glass (BPSG), BLACK DIAMOND® (APPLIED MATERIALS of Santa Clara, Calif.), amorphous fluorinated carbon, low dielectric constant (low-k) dielectric material, or combinations thereof. In some embodiments, conductive line 132 has a material including Al, Cu, Ti, Ta, W, molybdenum (Mo), TaN, TiN, WN, metal silicide, silicon, or combinations thereof. In some embodiments, etching stop layer 144 includes a dielectric material such as silicon carbide (SiC) or silicon oxy-nitride (SiON).

In some embodiments, resistance variable film 116 has a material comprising a high dielectric constant (high-k) dielectric material, a binary metal oxide, or a transition metal oxide. In some embodiments, resistance variable film 116 has a thickness ranging from 1 nm to 10 nm. As depicted in FIG. 1B, the portion of resistance variable film 116 sandwiched between upper surface 112a of first electrode 112 and lower surface 114a of second electrode 114 has a height H ranging from 20 nm to 100 nm.

Resistance variable film 116 is capable of being processed to form one or more "filaments" 160 to provide a conductive path such that resistance variable film 116 has a low resistance characteristic between upper surface 112a of first electrode 112 and lower surface 114a of second electrode 114. In some embodiments, the filaments 160 is formed by lining-up defect (e.g. oxygen) vacancies in a bottom portion of resistance variable film 116 between side surface 112b of first electrode 112 and side surface 114a of second electrode 114. In some embodiments, filaments 160 are formed by applying a voltage level greater than a predetermined threshold "forming voltage." Once filaments 160 are formed, filaments 160 remain present in the resistance variable film 116. Other operations (reset operation and set operation) disconnect or reconnect the resistance variable film 116 using a set voltage and/or a reset voltage having voltage levels less than the forming voltage.

Figure 2:
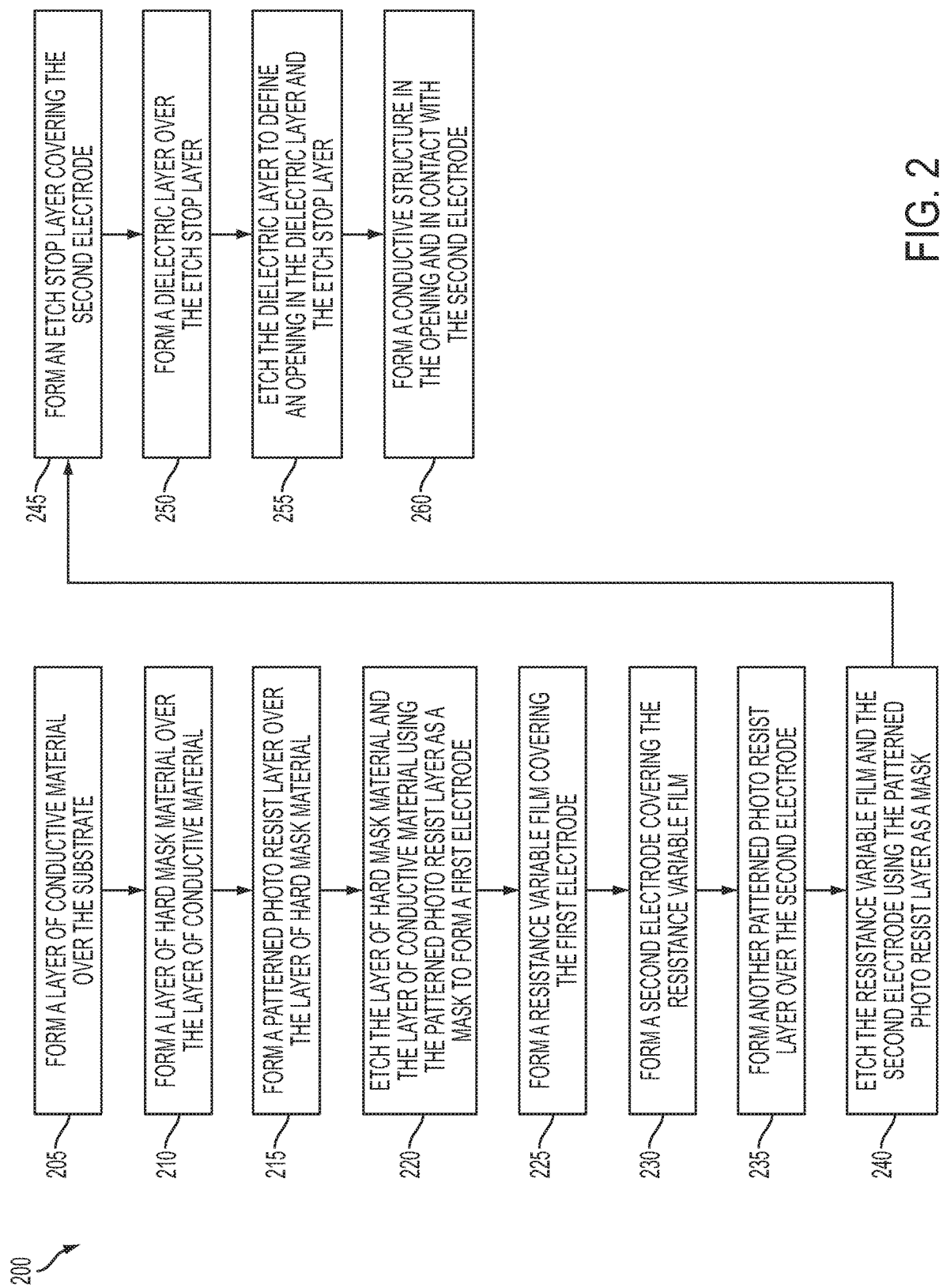
FIG. 2 is a flow chart of a method of making an RRAM cell in accordance with one or more embodiments.

FIG. 2 is a flow chart of a method 200 of making an RRAM cell 110 in accordance with one or more embodiments. FIGS. 3A-3K are cross-sectional views of a portion of an electrical device 100 including an RRAM cell 110 at various stages of manufacture in accordance with one or more embodiments. Components similar to those depicted in FIGS. 1A and 1B are given the same reference numbers. It is understood that additional operations may be performed before, during, and/or after the method 200 depicted in FIG. 2, and that some other processes may only be briefly described herein.

Figure 3A:
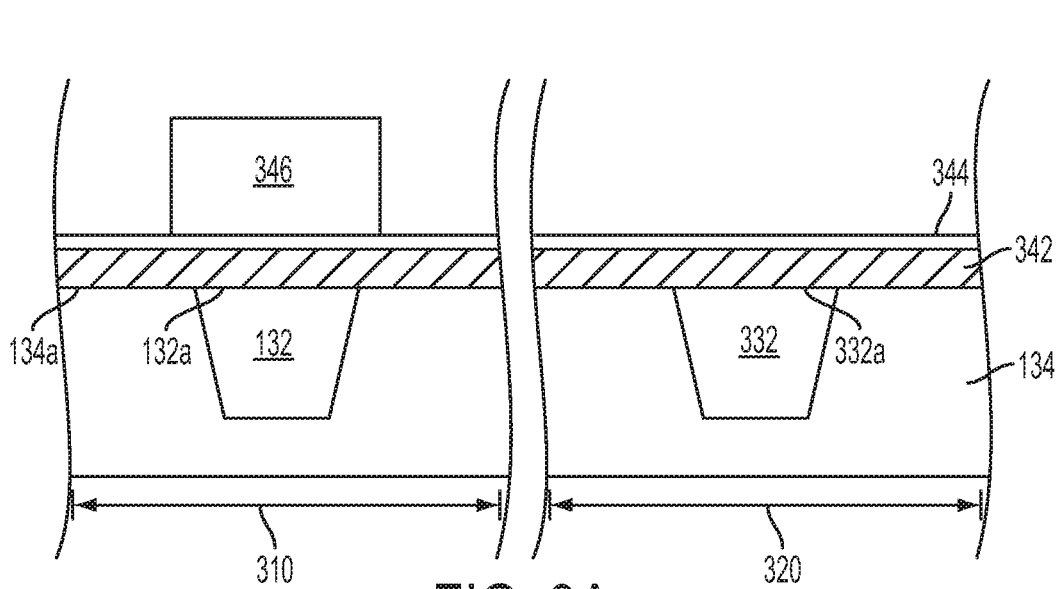
FIGS. 3A-3K are cross-sectional views of a portion of an electrical device including an RRAM cell at various stages of manufacture in accordance with one or more embodiments.

FIG. 3A is a cross-sectional view of electrical device 100 after performing operations 205, 210, and 215. As depicted in FIG. 2 and FIG. 3A, electrical device 100 includes a memory region 310 and a periphery region 320. Electrical device 100 includes a dielectric layer 134 formed over a substrate 120 (FIG. 1). Dielectric layer 134 has a conductive line 132 formed in memory region 310 and a conductive line 332 formed in periphery region 320.

In some embodiments, dielectric layer 134 has a material including silicon oxide, fluorinated silica glass (FSG), carbon doped silicon oxide, tetra-ethyl-ortho-silicate (TEOS) oxide, phosphosilicate glass (PSG), borophosphosilicate glass (BPSG), BLACK DIAMOND® (APPLIED MATERIALS of Santa Clara, Calif.), amorphous fluorinated carbon, low-k dielectric material, or combinations thereof. In some embodiments, dielectric layer 134 is formed by performing a chemical vapor deposition (CVD) process, an atomic layer deposition (ALD) process, a high density plasma CVD (HDPCVD) process, or a spin-on glass process.

In some embodiments, conductive lines 132 and 332 include Al, Cu, Ti, Ta, W, Mo, TaN, TiN, WN, metal silicide, silicon, or combinations thereof. In the embodiment depicted in FIG. 3A, conductive lines 132 and 332 are formed by lithography patterning and etching in the dielectric layer 134 and depositing one or more layers of conductive materials over the patterned dielectric layer 134, and subsequently performing a planarization process to form the conductive lines 132 and 332. Upper surfaces 132a and 332a of conductive lines 132 and 332 are substantially coplanar with an upper surface 134a of dielectric layer 134.

In operation 205, a layer of conductive material ("conductive layer 342") is formed over dielectric layer 134 and the substrate 120 in both memory region 310 and periphery region 320. In some embodiments, conductive layer 342 is only formed in memory region 310. In some embodiments, conductive layer 342 is formed using a process including electroless plating, sputtering, electro plating, PVD, or ALD. In some embodiments, conductive layer 342 has a material including Pt, Al, Cu, TiN, Au, Ti, Ta, TaN, W, WN, or combinations thereof. In some embodiments, conductive layer 342 has a thickness ranging from 10 nm to 100 nm.

In operation 210, a layer of dielectric material, such as a hard mask material, ("dielectric layer 344") is formed over the conductive layer 342 in both memory region 310 and periphery region 320. In operation 215, a patterned photo resist layer 346 is formed over the dielectric layer 344 for defining first electrode 112. In some embodiments, operation 210 is omitted, and patterned photo resist layer 346 is formed on conductive layer 342.

Figure 3B:
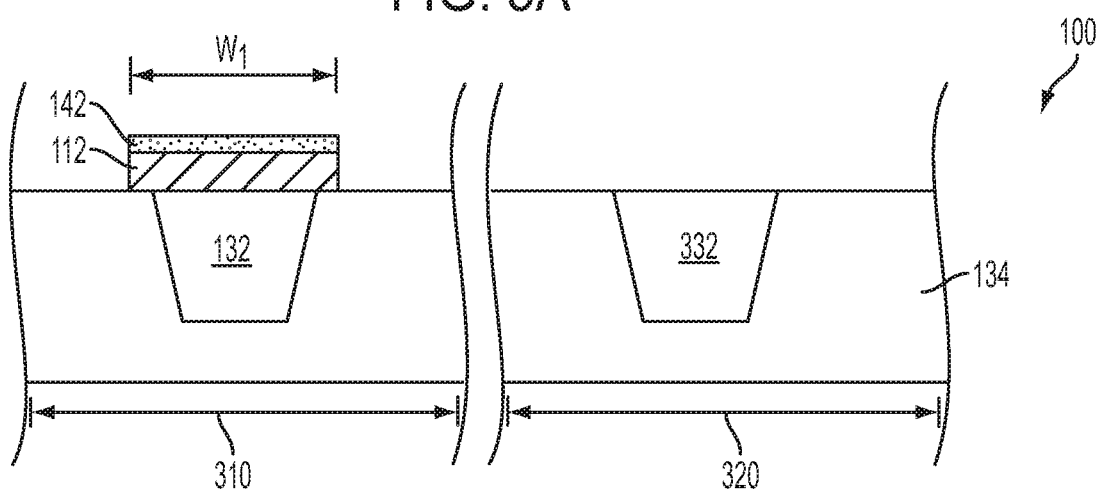

FIG. 3B is a cross-sectional view of electrical device 100 after performing operation 220. As depicted in FIG. 2 and FIG. 3B, in operation 220, conductive layer 342 and dielectric layer 344 are etched using patterned photo resist layer 346 as a mask. In some embodiments, operation 220 comprises performing a dry etching process or a wet etching process. After operation 220, first electrode 112 and dielectric layer 142 over first electrode 112 are formed over the dielectric layer 134. In some embodiments, dielectric layer 142 is omitted. In some embodiments, first electrode 112 has a width W1 ranging from 70 nm to 300 nm.

Figure 3C:
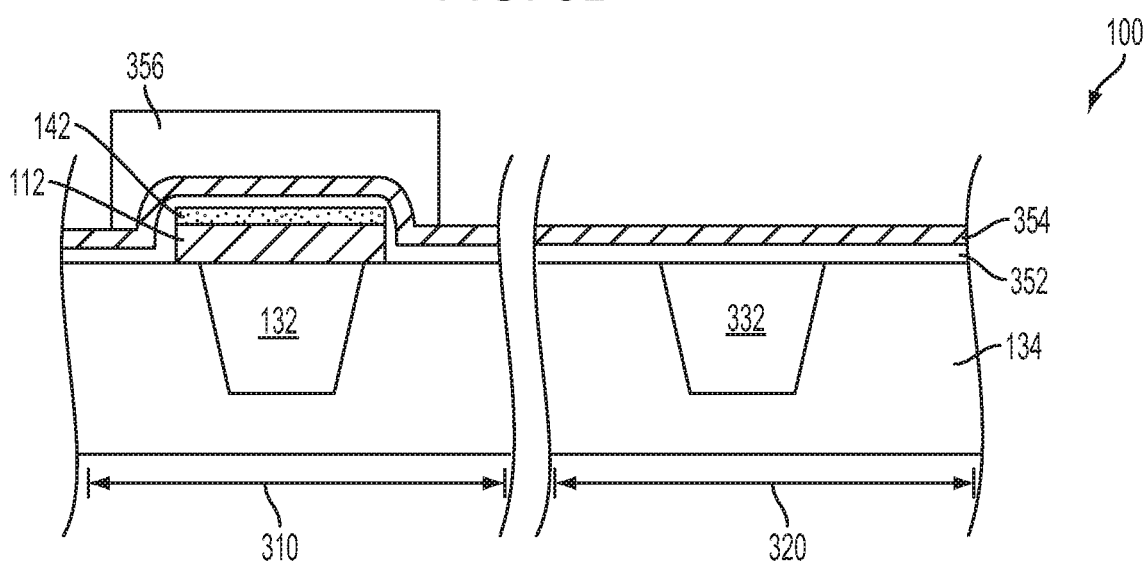

FIG. 3C is a cross-sectional view of electrical device 100 after performing operations 225, 230, and 235. As depicted in FIG. 2 and FIG. 3C, in operation 225, a layer of resistance variable material ("resistance variable layer") 352 is deposited over dielectric layer 146 and first electrode 112. In some embodiments, resistance variable layer 352 extends over dielectric layer 146 in memory region 310 and periphery region 320. In some embodiments, resistance variable layer 352 is conformally deposited over an upper surface 142a of dielectric layer 142 and side surfaces 142b and 112b of dielectric layer 142 and first electrode 112. Resistance variable layer 352 has a resistivity capable of switching between a high resistance state and a low resistance state, by application of an electrical voltage. In some embodiments, the resistance variable layer 352 has a material including a high-k dielectric material, a binary metal oxide, or a transition metal oxide. In some embodiments, resistance variable layer 352 includes nickel oxide, titanium oxide, hafnium oxide, zirconium oxide, zinc oxide, tungsten oxide, aluminum oxide, tantalum oxide, molybdenum oxide, or copper oxide. In some embodiments, resistance variable layer 352 is formed by performing a pulse laser deposition (PLD) process or an ALD process, such as an ALD process with a precursor containing zirconium and oxygen. In some embodiments, resistance variable layer 352 has a thickness ranging from 1 nm to 10 nm.

As depicted in FIG. 2 and FIG. 3C, in operation 230, one or more layers of conductive materials ("conductive layer") 354 is deposited over resistance variable layer 352 in memory region 310 and periphery region 320. In some embodiments, conductive layer 354 is formed using a process including electroless plating, sputtering, electro plating, PVD, or ALD. In some embodiments, conductive layer 354 has a material including Pt, Al, Cu, TiN, Au, Ti, Ta, TaN, W, WN, or combinations thereof. In some embodiments, conductive layer 354 has a thickness ranging from 10 nm to 100 nm. In some embodiments, conductive layer 354 includes a layer of capping material for forming capping layer 114c (FIG. 1B) and a layer of conductive material for forming main portion 114b (FIG. 1B). In some embodiments, conductive material for forming core portion 114b includes Ti, Ta, TiN, or TaN. In some embodiments, material for forming capping layer 114c includes Ti, Pt, or Ru.

Moreover, in operation 235, a patterned photo resist layer 356 is formed over conductive layer 354 in memory region 310 for defining second electrode 114.

Figure 3D:
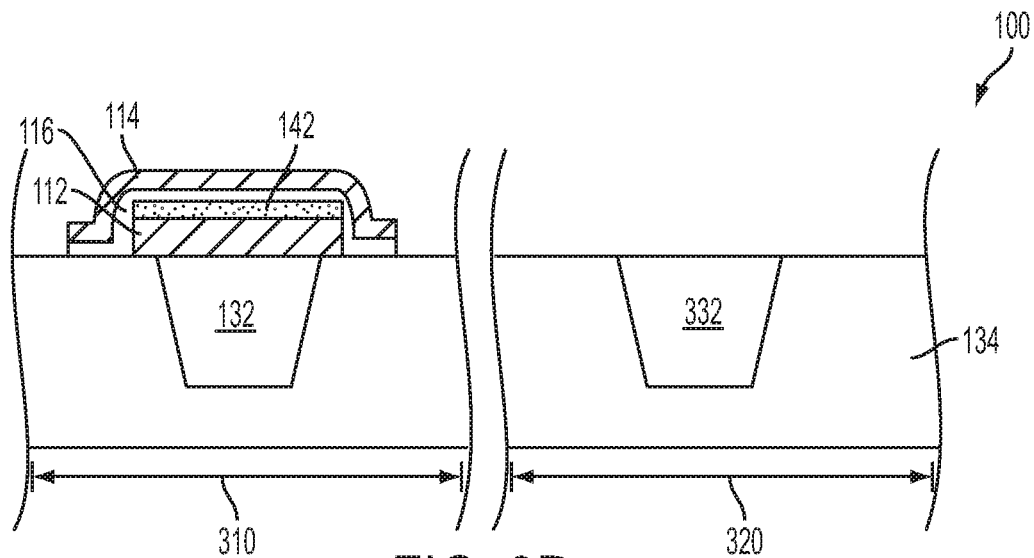

FIG. 3D is a cross-sectional view of electrical device 100 after performing operation 240. As depicted in FIG. 2 and FIG. 3D, in operation 240, resistance variable layer 352 and conductive layer 354 are etched using patterned photo resist layer 356 as a mask. In some embodiments, operation 240 comprises performing a dry etching process or a wet etching process. In some embodiments, operation 240 further includes removing patterned photo resist layer 356 after the etching. After operation 240, second electrode 114 and dielectric layer 142 over first electrode 112 are formed over the dielectric layer 134. In some embodiments, dielectric layer 142 is omitted.

Figure 3E:
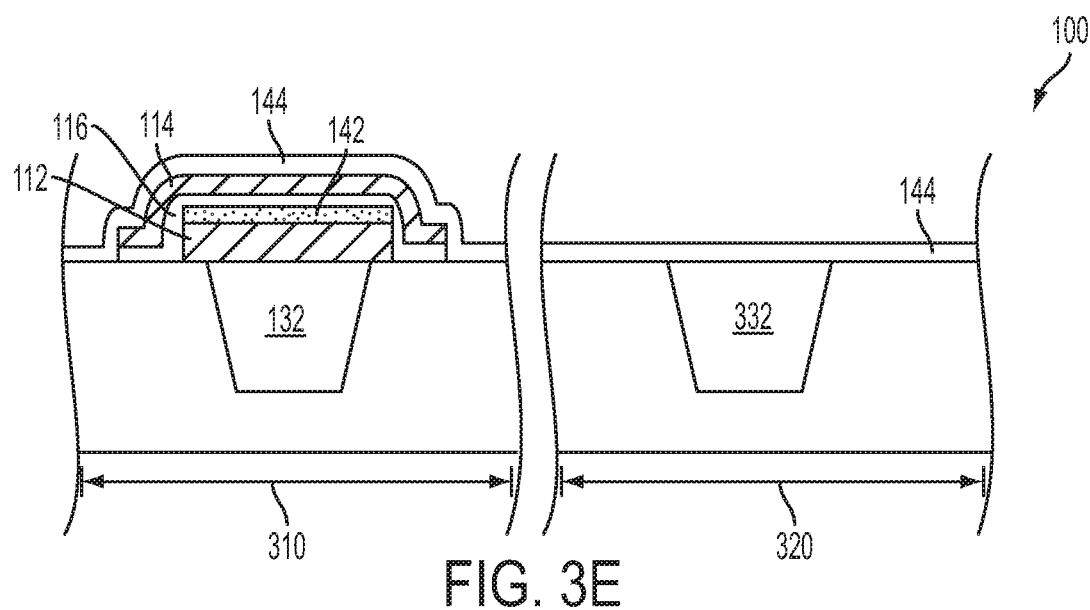

FIG. 3E is a cross-sectional view of electrical device 100 after performing operation 245. As depicted in FIG. 2 and FIG. 3E, in operation 245, an etch stop layer 144 is formed over the first electrode 112 and second electrode 114 and blanket formed over dielectric layer 134 in memory region 310 and periphery region 320. The etching stop layer 144 formed over second electrode 114 is usable to prevent second electrode 114 from being oxidized. In some embodiments, the etching stop layer 144 includes a dielectric material such as SiC or SiON. In some embodiments, etch stop layer 144 is formed by performing a CVD process, an ALD process, or a plasma enhanced CVD (PECVD) process.

Figure 3F:
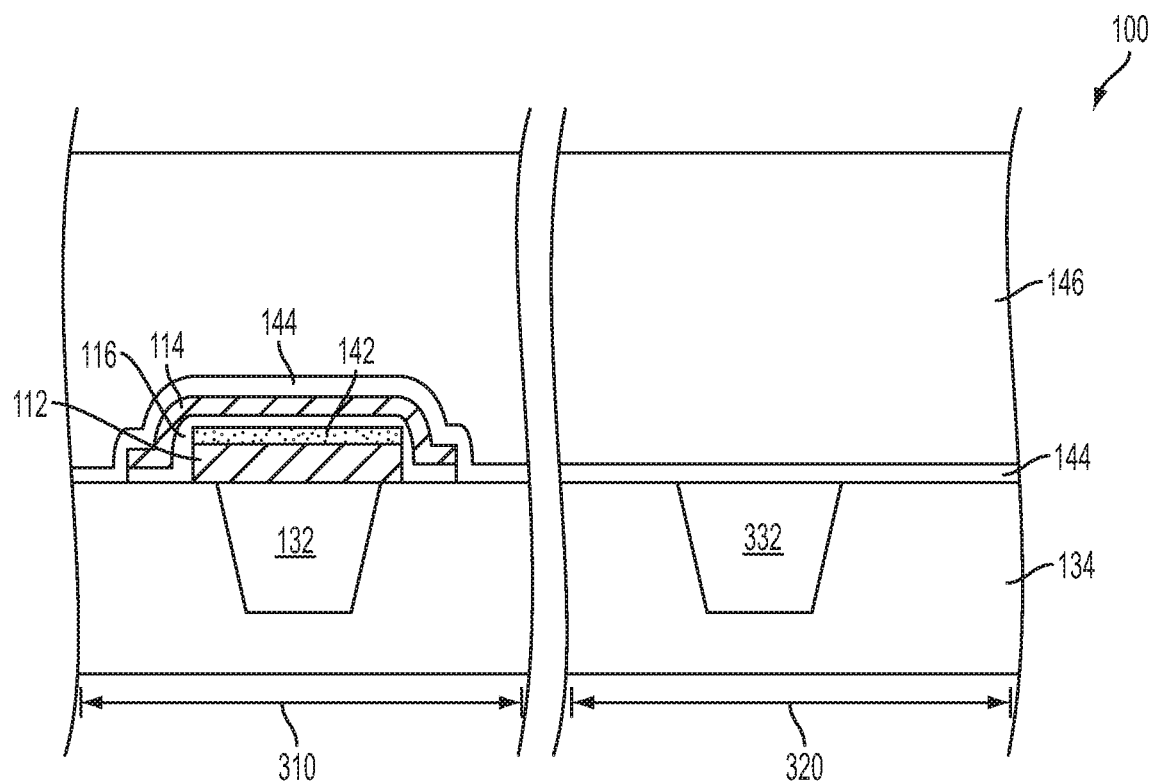

FIG. 3F is a cross-sectional view of electrical device 100 after performing operation 250. In operation 250, dielectric 146 is formed over the etch stop layer 144 in memory region 310 and periphery region 320. In some embodiments, dielectric layer 146 has a material including silicon oxide, fluorinated silica glass (FSG), carbon doped silicon oxide, tetra-ethyl-ortho-silicate (TEOS) oxide, phosphosilicate glass (PSG), borophosphosilicate glass (BPSG), BLACK DIAMOND® (APPLIED MATERIALS of Santa Clara, Calif.), amorphous fluorinated carbon, low-k dielectric material, or combinations thereof. In some embodiments, dielectric layer 146 is formed by performing a CVD process, an ALD process, a HDPCVD process, or a spin-on glass process.

Figure 3G:
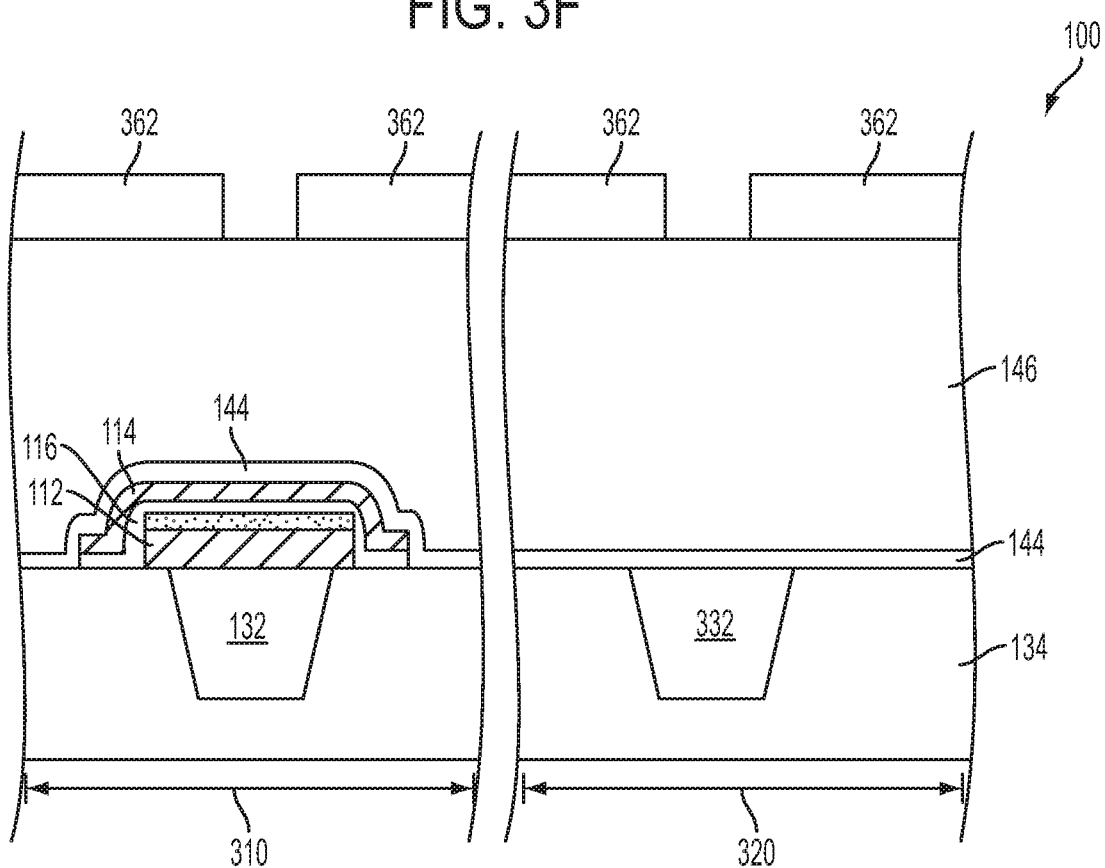
Figure 3H:
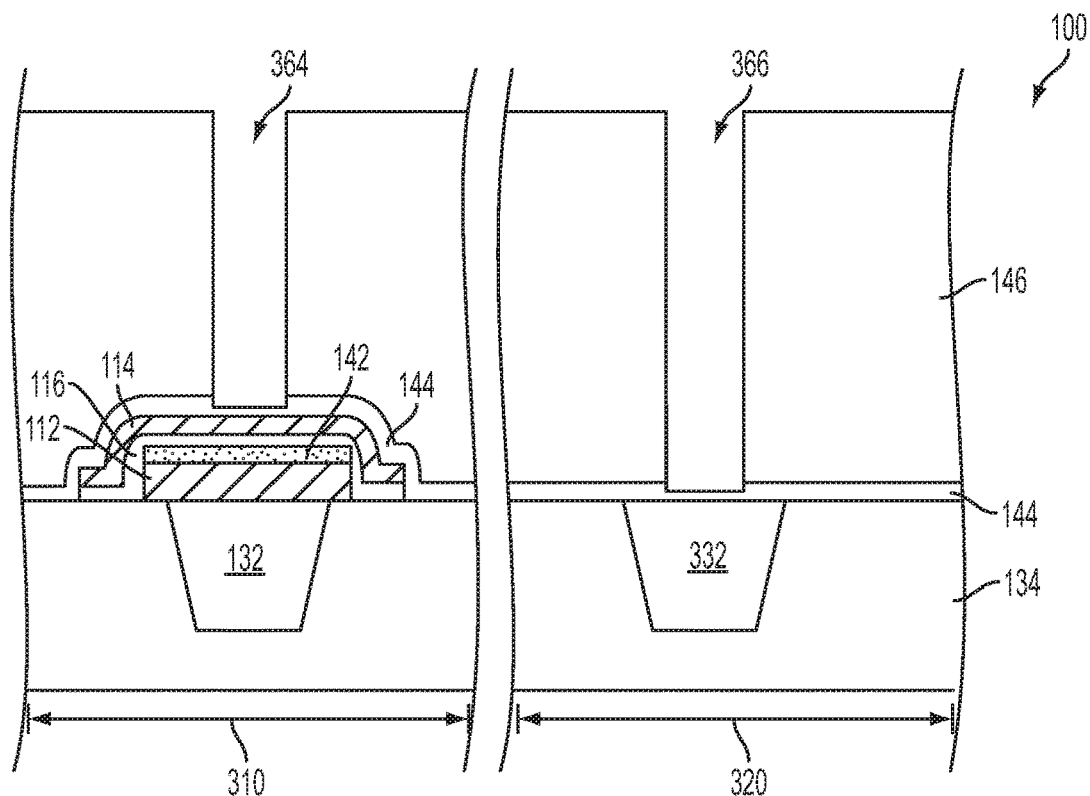
Figure 3I:
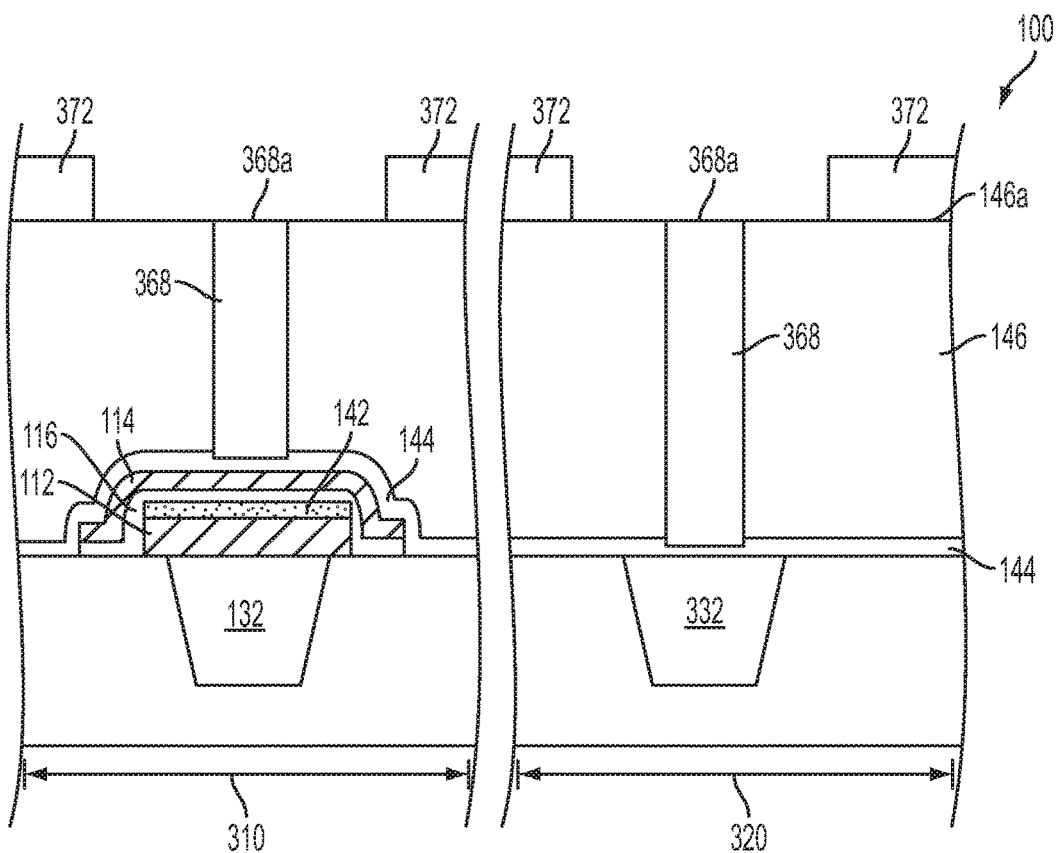
Figure 3J:
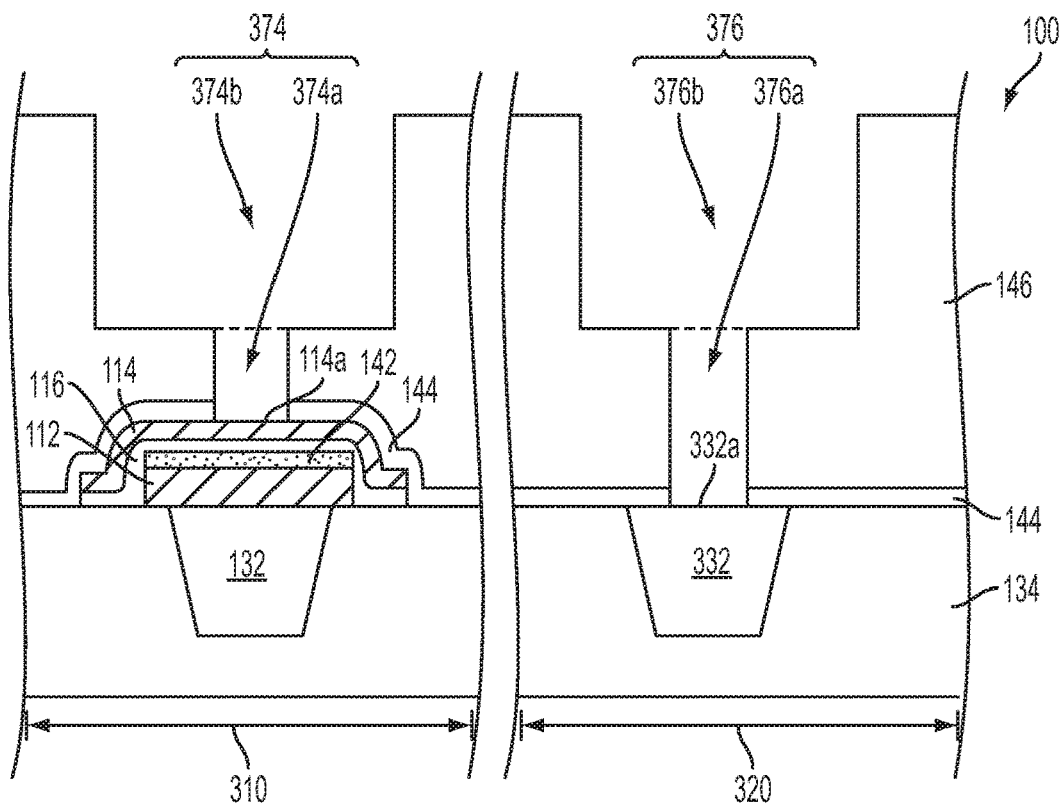

FIGS. 3G-3I are cross-sectional view of electrical device 100 at various stage during operation 255. FIG. 3J is a cross-sectional view of electrical device 100 after performing operation 255.

As depicted in FIG. 3G and FIG. 2, operation 255 includes forming a patterned photo resist layer 362 over dielectric layer 146 for defining one or more via openings over second electrode 114 and conductive line 332.

As depicted in FIG. 2 and FIG. 3H, operation 255 further includes etching a portion dielectric layer 146 and a portion of etch stop layer 144 using patterned photo resist layer 362 as a mask. As a result, a via opening 364 above second electrode 114 is defined in memory region 310 and a via opening 366 above conductive line 332 is defined in periphery region 320. In some embodiments, via opening 364 extends downwardly to expose an upper surface of second electrode 114. In some embodiments, via opening 366 extends downwardly to expose an upper surface of conductive line 332. In some embodiments, the formation of openings 364 and 366 includes performing a dry etching process or a wet etching process. After performing the etching for forming via openings 364 and 366, patterned photo resist layer 362 is from the upper surface of dielectric layer 146.

As depicted in FIG. 3I and FIG. 2, operation 255 further includes filling a dielectric material in via openings 364 and 366 to form sacrificial via plugs 368. Upper surface 368a of sacrificial via plugs 368 are substantially coplanar with the upper surface 146a of dielectric layer 146. In some embodiments, sacrificial via plugs 368 include a bottom anti-reflection coating (BARC) material. Then, a patterned photo resist layer 372 is formed over dielectric layer 146 for defining one or more trench openings over conductive line 332 in periphery region 320 and second electrode 114 in memory region 310.

As depicted in FIG. 2 and FIG. 3J, operation 250 further includes etching a portion dielectric layer 146, sacrificial via plugs 368, and/or a portion of etch stop layer 144 using patterned photo resist layer 372 as a mask. As a result, an opening 374 above second electrode 114 is defined in memory region 310 and an opening 376 above conductive line 332 is defined in periphery region 320. In some embodiments, opening 374 is also referred to as a combination of a via opening 374a and a trench opening 374b. In some embodiments, opening 376 is also referred to as a combination of a via opening 376a and a trench opening 376b. Opening 374 exposes an upper surface 114a of second electrode 114, and opening 376 exposes an upper surface 332a of conductive line 332. In some embodiments, the formation of openings 374 and 376 includes performing a dry etching process or a wet etching process. After performing the etching for forming via openings 374 and 376, patterned photo resist layer 372 is from the upper surface of dielectric layer 146.

Figure 3K:
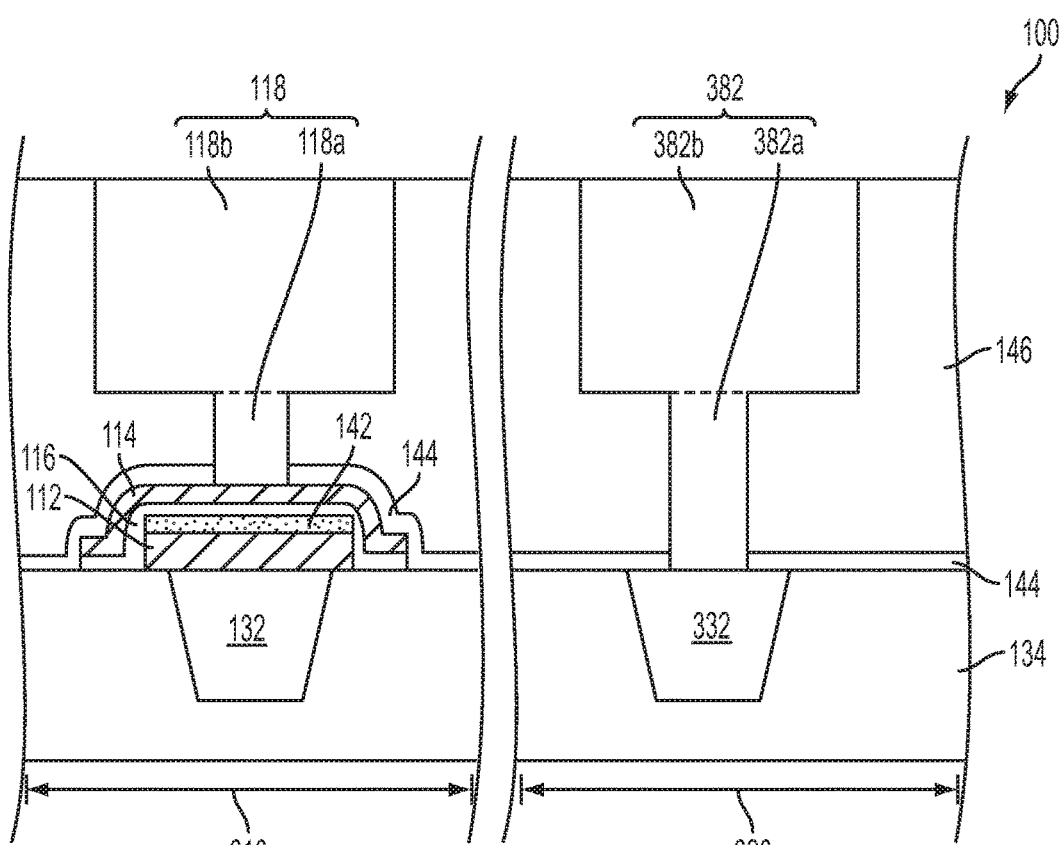

FIG. 3K is a cross-sectional view of electrical device 100 after performing operation 260. As depicted in FIG. 2 and FIG. 3K, in operation 260, a conductive material is deposited to fill opening 374 to form conductive member 118 electrically coupled with second electrode 114 and to fill opening 376 to form conductive member 382 electrically coupled with conductive line 332. Conductive member 118 is also referred to as a combination of via plug 118a and conductive line 118b directly on via plug 118a. Conductive member 382 is also referred to as a combination of via plug 382a and conductive line 382b directly on via plug 382a. In some embodiments, the conductive material for filling openings 374 and 376 includes Al, Cu, Ti, Ta, W, molybdenum (Mo), TaN, TiN, WN, metal silicide, silicon, or combinations thereof. In some embodiments, conductive line 118b of conductive member 118 being substantially level with conductive line 382b of conductive member 382.

After operation 260, the resulting structure in memory region 310 has a similar structure to electrical device 100 depicted in FIG. 1A.

In accordance with one embodiment, a manufacture includes a first electrode having an upper surface and a side surface, a resistance variable film over the first electrode, and a second electrode over the resistance variable film. The resistance variable film extends along the upper surface and the side surface of the first electrode. The second electrode has a side surface. A portion of the side surface of the first electrode and a portion of the side surface of the second electrode sandwich a portion of the resistance variable film.

In accordance with another embodiment, a manufacture includes a first electrode having an upper surface and a side surface, a first dielectric layer over the upper surface of the first electrode, a resistance variable film having an upper portion and a side portion, and a second electrode over the resistance variable film. The upper portion of the resistance variable film is over the first dielectric layer. The side portion of the resistance variable film extends along the side surface of the first electrode. The second electrode covers the upper portion and the side portion of the resistance variable film. The second electrode has a side surface. A portion of the side surface of the first electrode and a portion of the side surface of the second electrode sandwich a portion of the side portion of the resistance variable film.

In accordance with another embodiment, a method includes forming a first electrode over a substrate. A resistance variable film is formed to cover an upper surface of the first electrode and a side surface of the first electrode. A second electrode is formed to cover an upper portion of the resistance variable film and a side portion of the resistance variable film. A portion of the first electrode and a portion of the second electrode sandwich a portion of the side portion of the resistance variable film.

In accordance with another embodiment, a semiconductor device includes a first dielectric layer over a substrate, a first contact within the first dielectric layer, a topmost surface of the first contact being level with a topmost surface of the first dielectric layer, a first electrode in physical contact with the topmost surface of the first contact and the topmost surface of the first dielectric layer, a variable resistance element in physical contact with the topmost surface of the first dielectric layer and a sidewall of the first electrode, and a second electrode in physical contact with the variable resistance element.

In accordance with another embodiment, a semiconductor device includes a first contact over a substrate, a first electrode over the first contact, a first dielectric layer over the first electrode, a variable resistance element in physical contact with a sidewall of the first electrode and a topmost surface of the first dielectric layer, a second electrode over the variable resistance element, and a first conductive element in physical contact with a topmost surface of the second electrode.

In accordance with another embodiment, a semiconductor device includes a first dielectric layer over a substrate, a first contact within a first region of the first dielectric layer, a second contact within a second region of the first dielectric layer, a topmost surface of the first contact being level with a topmost surface of the second contact, a first electrode in physical contact with the first contact, a variable resistance element extending along a topmost surface and sidewalls of the first electrode, a second electrode in physical contact with the variable resistance element, a second dielectric layer over the second electrode and the second contact, a first conductive element within the second dielectric layer and in physical contact with the second electrode, and a second conductive element within the second dielectric layer and in physical contact with the second contact, a topmost surface of the first conductive element being level with a topmost surface of the second conductive element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first dielectric layer over a substrate;
   a first contact within the first dielectric layer, a topmost surface of the first contact being level with a topmost surface of the first dielectric layer;

a first electrode in physical contact with the topmost surface of the first contact and the topmost surface of the first dielectric layer;
a variable resistance element in physical contact with the topmost surface of the first dielectric layer and a sidewall of the first electrode;
a second electrode in physical contact with the variable resistance element;
a second dielectric layer over the second electrode;
a first conductive element within the second dielectric layer and in physical contact with the second electrode; and
a first etch stop layer between the second electrode and the second dielectric layer, the first etch stop layer being in physical contact with the topmost surface of the first dielectric layer, the first conductive element extending through the first etch stop layer.

2. The semiconductor device of claim 1, further comprising a third dielectric layer between the variable resistance element and the first electrode.

3. The semiconductor device of claim 1, further comprising a second contact within the first dielectric layer, a topmost surface of the second contact being level with the topmost surface of the first dielectric layer.

4. The semiconductor device of claim 3, further comprising:
a third dielectric layer over the second contact; and
a second conductive element within the third dielectric layer and in physical contact with the second contact.

5. The semiconductor device of claim 4, further comprising a second etch stop layer between the first dielectric layer and the third dielectric layer, the second conductive element extending through the second etch stop layer.

6. A semiconductor device comprising:
a first contact over a substrate;
a first electrode over the first contact;
a first dielectric layer over the first electrode;
a variable resistance element in physical contact with a sidewall of the first electrode and a topmost surface of the first dielectric layer;
a second electrode over the variable resistance element;
a first conductive element in physical contact with a topmost surface of the second-electrode;
a second contact over the substrate;
a second conductive element in physical contact with a topmost surface of the second contact; and
an etch stop layer in physical contact with the topmost surface of the second electrode and the topmost surface of the second contact.

7. The semiconductor device of claim 6, further comprising a second dielectric layer over the substrate, the first contact extending into the second dielectric layer.

8. The semiconductor device of claim 7, wherein the variable resistance element is in physical contact with a topmost surface of the second dielectric layer.

9. The semiconductor device of claim 6, wherein the etch stop layer is in physical contact with the variable resistance element.

10. The semiconductor device of claim 6, wherein a width of the first electrode is greater than a width of the first contact.

11. A semiconductor device comprising:
a first dielectric layer over a substrate;
a first contact within a first region of the first dielectric layer;
a second contact within a second region of the first dielectric layer, a topmost surface of the first contact being level with a topmost surface of the second contact;
a first electrode in physical contact with the first contact;
a variable resistance element extending along a topmost surface and sidewalls of the first electrode;
a second electrode in physical contact with the variable resistance element;
a second dielectric layer over the second electrode and the second contact;
a first conductive element within the second dielectric layer and in physical contact with the second electrode; and
a second conductive element within the second dielectric layer and in physical contact with the second contact, a topmost surface of the first conductive element being level with a topmost surface of the second conductive element.

12. The semiconductor device of claim 11, wherein the topmost surface of the first contact being level with a topmost surface of the first dielectric layer.

13. The semiconductor device of claim 11, further comprising a third dielectric layer between the variable resistance element and the first electrode.

14. The semiconductor device of claim 11, further comprising an etch stop layer between the first dielectric layer and the second dielectric layer.

15. The semiconductor device of claim 14, wherein the first conductive element and the second conductive element extend through the etch stop layer.

16. The semiconductor device of claim 14, wherein the etch stop layer is in physical contact with the variable resistance element and the second electrode.

17. The semiconductor device of claim 1, wherein a width of the second electrode is greater than a width of the first electrode.

18. The semiconductor device of claim 2, wherein a width of the second electrode is greater than a width of the third dielectric layer.

19. The semiconductor device of claim 6, wherein a thickness of the variable resistance element is between 1 nm and 10 nm.

20. The semiconductor device of claim 6, wherein a bottommost surface of the first conductive element is above a bottommost surface of the second conductive element.

* * * * *